(12) United States Patent
Tang et al.

(10) Patent No.: US 10,454,023 B2
(45) Date of Patent: Oct. 22, 2019

(54) SPIN CURRENT MAGNETIZATION ROTATIONAL ELEMENT

(71) Applicant: TDK CORPORATION, Tokyo (JP)

(72) Inventors: Zhenyao Tang, Tokyo (JP); Yohei Shiokawa, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/976,997

(22) Filed: May 11, 2018

(65) Prior Publication Data

US 2018/0337327 A1    Nov. 22, 2018

(30) Foreign Application Priority Data

May 18, 2017 (JP) ................. 2017-098972

(51) Int. Cl.
*H01L 43/02* (2006.01)
*H01F 10/32* (2006.01)
(Continued)

(52) U.S. Cl.
CPC ............ H01L 43/02 (2013.01); G11C 11/161 (2013.01); G11C 11/1675 (2013.01); H01F 10/329 (2013.01); H01F 10/3254 (2013.01); H01F 10/3268 (2013.01); H01F 10/3286 (2013.01); H01L 43/08 (2013.01); *H01L 27/222* (2013.01)

(58) Field of Classification Search
CPC ....... H01L 43/02; H01L 43/08; H01L 27/222; H01F 10/329; H01F 10/3268; H01F 10/3254; H01F 10/3286; G11C 11/1675; G11C 11/161
See application file for complete search history.

(56) References Cited

U.S. PATENT DOCUMENTS 8,350,347 B2    1/2013   Gaudin et al.
2010/0072528 A1*  3/2010  Inokuchi ........... H01L 29/66984
                                        257/295
(Continued)

FOREIGN PATENT DOCUMENTS

WO    2016/021468 A1    2/2016

OTHER PUBLICATIONS

S. Fukami et al. "A Spin-Orbit Torque Switching Scheme With Collinear Magnetic Easy Axis and Current Configuration". Nature Nanotechnology, DOI:10.1038/NNANO.2016.29, Mar. 21, 2016, pp. 1-6.

(Continued)

*Primary Examiner* — Yosef Gebreyesus
(74) *Attorney, Agent, or Firm* — Oliff PLC

(57) ABSTRACT

A spin current magnetization rotational element includes: a ferromagnetic metal layer; a spin-orbit torque wiring configured to extend in a first direction perpendicular to a lamination direction of the ferromagnetic metal layer and formed on one surface of the ferromagnetic metal layer; and a ferromagnetic electrode layer formed outside the ferromagnetic metal layer on any of surfaces of the spin-orbit torque wiring in a top view from the lamination direction. A direction of magnetization of the ferromagnetic metal layer is changeable by spin-orbit torque generated by a spin-orbit interaction in the spin-orbit torque wiring and an influence of spin diffused from the ferromagnetic electrode layer.

9 Claims, 6 Drawing Sheets

(51) Int. Cl.
*G11C 11/16* (2006.01)
*H01L 43/08* (2006.01)
*H01L 27/22* (2006.01)

(56) References Cited

U.S. PATENT DOCUMENTS

2015/0348606 A1 12/2015 Buhrman et al.
2017/0222135 A1 8/2017 Fukami et al.

OTHER PUBLICATIONS

Y. K. Kato et al. "Observation of the Spin Hall Effect in Semiconductors". Science Magazine, vol. 306, Dec. 10, 2004, pp. 1910-1913.
Ioan Mihai Miron et al. "Perpendicular Switching of a Single Ferromagnetic Layer Induced by In-Plane Current Injection". Nature, vol. 476, Aug. 11, 2011, pp. 189-194.
Luqiao Liu et al. "Spin Torque Switching With the Giant Spin Hall Effect of Tantalum". Science Magazine, vol. 336, Mar. 13, 2012, pp. 1-19 and 1-12.
Luqiao Liu et al. "Current-Induced Switching of Perpendicularly Magnetized Magnetic Layers Using Spin Torque From the Spin Hall Effect". Physical Review Letters, vol. 109, Aug. 31, 2012, pp. 099602-1 through 099602-5.
Ki-Seung Lee et al. "Threshold Current for Switching of a Perpendicular Magnetic Layer Induced by Spin Hall Effect". Applied Physics Letters, vol. 102, Mar. 25, 2013, pp. 1-17.
Ki-Seung Lee et al. "Thermally Activated Switching of Perpendicular Magnet by Spin-Orbit Spin Torque". Applied Physics Letters, vol. 104, Feb. 21, 2014, pp. 072413-1 through 072413-5.
Shunsuke Fukami et al. "Magnetization Switching by Spin-Orbit Torque in an Antiferromagnet-Ferromagnet Bilayer System". Nature Materials, vol. 15, Feb. 15, 2016, pp. 535-542.
S. Takahashi et al. "Spin Injection and Detection in Magnetic Nanostructures". Physical Review B, vol. 67, Feb. 28, 2003, pp. 052409-1 through 052409-4.
Yeongkyo Seo et al. "Area-Efficient SOT-MRAM With a Schottky Diode". IEEE Electron Device Letters, vol. 37, No. 8, Aug. 2016, pp. 982-985.
Wei Zhang et al. "Spin Hall Effects in Metallic Antiferromagnets". Physical Review Letters, vol. 113, Nov. 7, 2014, pp. 196602-1 through 196602-6.

* cited by examiner

SPIN CURRENT MAGNETIZATION ROTATIONAL ELEMENT

BACKGROUND OF THE INVENTION

Field of the Invention

The present invention relates to a spin current magnetization rotational element.

Priority is claimed on Japanese Patent Application No. 2017-098972, filed on May 18, 2017, the content of which is incorporated herein by reference.

Description of Related Art

A giant magneto resistance (GMR) element made up of a multilayered film of a ferromagnetic layer and a non-magnetic layer, and a tunneling magneto resistance (TMR) element using an insulating layer (a tunnel barrier layer, a barrier layer) for a non-magnetic layer are known as magneto resistance effect elements. In comparison with the GMR element, the TMR element generally has higher element resistance, and a greater magneto resistance (MR) ratio. These magneto resistance effect elements have attracted attention as elements for a magnetic sensor, a high-frequency component, a magnetic head, and a non-volatile random-access memory (e.g., an MRAM).

The MRAM reads and writes data using a characteristic in which element resistance is changed when directions of magnetization of two ferromagnetic layers between which a non-magnetic layer is sandwiched are changed. As a writing mode of the MRAM, a mode of performing writing (magnetization reversal) using a magnetic field generated by a current, or a mode of performing writing (magnetization reversal) using spin transfer torque (STT) generated by applying a current in a lamination direction of a magneto resistance effect element is known.

The magnetization reversal of the magneto resistance effect element using the STT is efficient considering the viewpoint of energy efficiency, but it is required to apply the current in the lamination direction of the magneto resistance effect element. In addition, a reversal current density required to perform the magnetization reversal is also high. In view of a long lifespan of the TMR element, it is desirable that the reversal current density be low. This point is equally applied to the GMR element.

Therefore, magnetization reversal using a pure spin current generated by a spin-orbit interaction as means for reducing the reversal current has recently drawn attention (e.g., Non-Patent Literature 1). The pure spin current generated by the spin-orbit interaction induces spin-orbit torque (SOT), and magnetization reversal is caused by the SOT. Upward spin electrons and downward spin electrons are the same in number and flow in directions opposite to each other, and thereby the pure spin current is generated, and flows of charges are offset. For this reason, the current flowing to the magneto resistance effect element is zero, and making a lifespan of the magneto resistance effect element longer using the spin-orbit torque (SOT) is expected.

NON-PATENT DOCUMENTS

[Non-Patent Document 1] S. Fukami, T. Anekawa, C. Zhang, and H. Ohno, Nature Nanotechnology, DOI: 10.1038/NNANO.2016.29.

The magnetization reversal using the spin-orbit interaction set forth in Non-Patent Document 1 is excellent in that there is no need to apply the current in the lamination direction of the magneto resistance effect element. However, to sufficiently inject magnetization required for the magnetization reversal by the spin current, a current having a high current density needs to be applied in a direction perpendicular to the lamination direction of the magneto resistance effect element. A current having high current density generates heat, and reduces energy efficiency. External factors such as generated heat are responsible for reducing the stability of magnetization of the ferromagnetic metal layer.

Therefore, the present invention is contrived in view of the above problems, and an object of the present invention is to provide a spin current magnetization rotational element that can be driven with a low current.

SUMMARY OF THE INVENTION

The inventors have found that if a ferromagnetic electrode layer is provided near a ferromagnetic metal layer, a direction of magnetization of the ferromagnetic metal layer can be easily changed using polarization spin diffused by a spin polarization current flowing from the ferromagnetic electrode layer in addition to spin-orbit torque (SOT) generated by a spin-orbit interaction. That is, the present invention provides the following means to solve the above problems.

(1) A spin current magnetization rotational element according to a first aspect includes: a ferromagnetic metal layer; a spin-orbit torque wiring configured to extend in a first direction perpendicular to a lamination direction of the ferromagnetic metal layer and formed on one surface of the ferromagnetic metal layer; and a ferromagnetic electrode layer formed outside the ferromagnetic metal layer on any of surfaces of the spin-orbit torque wiring in a top view from the lamination direction. A direction of magnetization of the ferromagnetic metal layer is variable by spin-orbit torque generated by a spin-orbit interaction in the spin-orbit torque wiring and an influence of spin diffused from the ferromagnetic electrode layer.

(2) In the spin current magnetization rotational element according to the above aspect, a distance between the ferromagnetic electrode layer and the ferromagnetic metal layer may be within five times a spin diffusion length of the spin-orbit torque wiring.

(3) In the spin current magnetization rotational element according to the above aspect, when the ferromagnetic electrode layer is provided on a surface of the spin-orbit torque wiring which is opposite to the ferromagnetic metal layer, a portion at which the ferromagnetic electrode layer and the ferromagnetic metal layer overlap each other in the top view from the lamination direction may be provided.

(4) In the spin current magnetization rotational element according to the above aspect, a polarization direction of the spin diffused from the ferromagnetic electrode layer and a direction of spin accumulated on an interface between the spin-orbit torque wiring and the ferromagnetic metal layer by the spin-orbit interaction may be coincident with each other.

(5) In the spin current magnetization rotational element according to the above aspect, a barrier layer having an insulation characteristic may be provided between the ferromagnetic metal layer and the spin-orbit torque wiring.

(6) In the spin current magnetization rotational element according to the above aspect, the spin-orbit torque wiring may include a non-magnetic heavy metal whose atomic number is 39 or more and which has d electrons or f electrons in an outermost shell.

(7) In the spin current magnetization rotational element according to the above aspect, the direction of the magnetization of the ferromagnetic metal layer and a direction of magnetization of the ferromagnetic electrode layer may be parallel or anti-parallel to each other.

(8) In the spin current magnetization rotational element according to the above aspect, the ferromagnetic electrode layer may be one of a plurality of ferromagnetic electrode layers that are present outside the ferromagnetic metal layer in the top view from the lamination direction.

(9) In the spin current magnetization rotational element according to the above aspect, a non-magnetic layer and a second ferromagnetic metal layer may be further provided on a surface of the spin-orbit torque wiring which is opposite to the ferromagnetic metal layer in turn from a side of the spin-orbit torque wiring.

According to the spin current magnetization rotational element relevant to the aspect, a direction of magnetization of a ferromagnetic metal layer can be changed even with a low current

DETAILED DESCRIPTION OF THE INVENTION

Hereinafter, embodiments will be described in detail with appropriate reference to the drawings. The drawings used in the following description may illustrate characteristic portions in an enlarged size for the sake of convenience to facilitate understanding of features of the present invention, and a dimensional ratio of each constituent element may be different from reality. Materials, dimensions, etc. exemplified in the following description are examples, and the present invention is not limited thereto, and may be implemented with appropriate modification without departing from the scope in which effects of the present invention are exhibited.

First Embodiment

Figure 1:
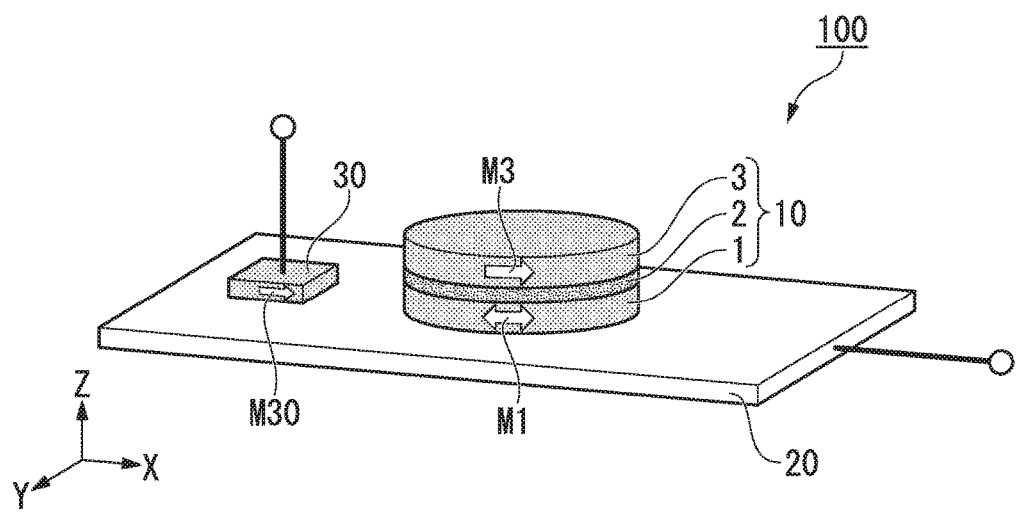
FIG. 1 is a perspective view schematically illustrating a spin current magnetization rotational element according to a first embodiment.

FIG. 1 is a perspective view schematically illustrating a spin current magnetization rotational element according to a first embodiment.

As illustrated in FIG. 1, the spin current magnetization rotational element 100 according to the first embodiment includes a magneto resistance effect element 10, a spin-orbit torque wiring 20, and a ferromagnetic electrode layer 30.

Hereinafter, a first direction in which the spin-orbit torque wiring 20 extends is defined as an x direction, a second direction which is an in-plane direction in which the spin-orbit torque wiring 20 extends and which is perpendicular to the first direction is defined as a y direction, and a laminating direction of the magneto resistance effect element 10 which is perpendicular to both the x direction and the y direction is defined as a z direction.

A direction of magnetization M1 of a ferromagnetic metal layer 1 of the magneto resistance effect element 10 is changed, and thereby the spin current magnetization rotational element 100 is operated. The direction of magnetization M1 of the ferromagnetic metal layer 1 is changed by causing a current to flow between the ferromagnetic electrode layer 30 and one end of the spin-orbit torque wiring 20 in the x direction.

<Magneto Resistance Effect Element>

The magneto resistance effect element 10 has the ferromagnetic metal layer 1, a non-magnetic layer 2, and a second ferromagnetic metal layer 3 from the spin-orbit torque wiring 20 side in turn. The magneto resistance effect element 10 outputs a change in relative angle between magnetization M1 of the ferromagnetic metal layer 1 and magnetization M3 of the second ferromagnetic metal layer 3 as a change in resistance value.

When the magneto resistance effect element 10 is a coercivity difference type (a pseudo spin valve type), coercivity of the second ferromagnetic metal layer 3 is greater than coercivity of the ferromagnetic metal layer 1. When the magneto resistance effect element 10 is an exchange bias type (a spin-valve; a spin-valve type), an antiferromagnetic layer is laminated on a side of the second ferromagnetic metal layer 3 which is opposite to the ferromagnetic metal layer 1, and a magnetization direction of the second ferromagnetic metal layer 3 is fixed by exchange coupling with the antiferromagnetic layer.

As a lamination constitution of the magneto resistance effect element 10, a lamination constitution of a generally known magneto resistance effect element may be adopted. Each layer may be made up of a plurality of layers, and may include layers other than the aforementioned layers. In the magneto resistance effect element 10, the ferromagnetic metal layer 1 is called a free layer or a recording layer, and the second ferromagnetic metal layer 3 is called a fixed layer or a reference layer.

As the ferromagnetic metal layer 1 and the second ferromagnetic metal layer 3, generally known layers may be used. For example, as the ferromagnetic metal layer 1 and the second ferromagnetic metal layer 3, a metal selected from the group consisting of Cr, Mn, Co, Fe, and Ni, and an alloy that includes one or more of these metals and exhibits ferromagnetism may be used. In addition, an alloy including these metals and at least one or more of B, C, and N may be used. Specific examples include Co—Fe and Co—Fe—B.

A Heusler alloy is preferably used for the ferromagnetic metal layer 1 and the second ferromagnetic metal layer 3. A Heusler alloy includes an intermetallic compound having a chemical composition of $X_2YZ$, where X is a transition metal element or a noble metal element of the Co, Fe, Ni, or Cu group on the periodic table, Y is a transition metal of the Mn, V, Cr, or Ti group, and may be an element belongs to X, and Z is a representative element of group III to group V. A Heusler alloy has a spin polarizability of 1 in theory, and high output is obtained. For example, Heusler alloys include $Co_2FeSi$, $Co_2MnSi$, $Co_2Mn_{1-a}Fe_aAl_bSi_{1-b}$, and the like.

When the magneto resistance effect element 10 is the exchange bias type, the antiferromagnetic layer may be laminated on the side of the second ferromagnetic metal layer 3 which is opposite to the ferromagnetic metal layer 1. The coercivity of the second ferromagnetic metal layer 3 is increased by antiferromagnetic coupling with magnetization of the antiferromagnetic layer. An antiferromagnetic material such as IrMn or PtMn may be used for the antiferromagnetic layer. To prevent a leakage magnetic field of the second ferromagnetic metal layer 3 from affecting the ferromagnetic metal layer 1, the magneto resistance effect element 10 may have a synthetic ferromagnetic coupling structure.

The non-magnetic layer 2 may be an insulator, a semiconductor, or a metal. When the non-magnetic layer 2 is formed of an insulator, the magneto resistance effect element 10 becomes a tunneling magneto resistance (TMR) element. When the non-magnetic layer 2 is formed of a semiconductor or a metal, the magneto resistance effect element 10 becomes a giant magneto resistance (GMR) element.

A generally known material may be used for the non-magnetic layer 2. For example, when the non-magnetic layer 2 is formed of an insulator or a semiconductor, hexagonal-BN, graphene, $HfO_2$, $Y_2O_3$, TaO, GaO, TiO, InO, BaO, $CaF_2$, $Al_2O_3$, $SiO_2$, MgO, and $MgAl_2O_4$ may be used as the material of the non-magnetic layer 2. Among them, MgO and $MgAl_2O_4$ are materials in which a coherent tunnel can be realized, and thus an MR ratio can be increased. In addition, a material in which one or both of Mg and Al of MgO or $MgAl_2O_4$ is substituted with Zn, Cd, Ag, Pt, Pb, Ga, In, Ge, or the like may also be used as the non-magnetic layer 2.

On the other hand, when the non-magnetic layer 2 is formed of a metal, Cu, Au, Ag, or the like may be used as the material of the non-magnetic layer 2.

The magneto resistance effect element 10 may have other layers in addition to these layers. For example, an underlayer may be provided on an interface between the ferromagnetic metal layer 1 and the spin-orbit torque wiring 20. A cap layer may be provided on a surface of the second ferromagnetic metal layer 3 which is opposite to the non-magnetic layer 2. The underlayer improves a lattice-matching characteristic between the ferromagnetic metal layer 1 and the spin-orbit torque wiring 20. The cap layer relieves lattice strain of the magneto resistance effect element 10, and suppresses diffusion of atoms constituting the magneto resistance effect element 10.

Figure 11:
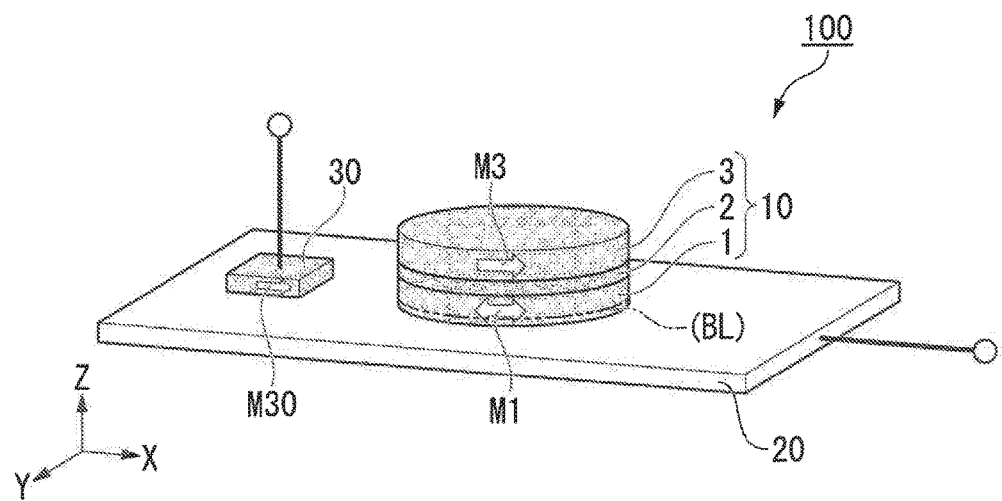
FIG. 11 is a schematic perspective view illustrating a spin current magnetization rotational element according to a first embodiment.

The underlayer may be a barrier layer BL having an insulation characteristic as shown in FIG. 11. When the barrier layer BL is present, an amount of spin accumulated on the interface between the ferromagnetic metal layer 1 and the spin-orbit torque wiring 20 increases. The spin accumulated on the interface changes the direction of magnetization M1 of the ferromagnetic metal layer 1.

The underlayer or the barrier layer BL preferably does not dissipate spin that is propogated from the spin-orbit torque wiring 20 of the ferromagnetic metal layer 1. For this reason, a substance having a long spin diffusion length (e.g., the spin diffusion length is 100 nm or longer) is preferably used for the underlayer or the barrier layer.

A thickness of the underlayer or the barrier layer BL is preferably shorter than or equal to the spin diffusion length of the substance of which the layer is formed. If the thickness of the layer is shorter than or equal to the spin diffusion length, the spin propagated from the spin-orbit torque wiring 20 can be sufficiently transmitted to the ferromagnetic metal layer 1.

<Spin-Orbit Torque Wiring>

The spin-orbit torque wiring 20 extends in the x direction. The spin-orbit torque wiring 20 is connected to one surface of the ferromagnetic metal layer 1 in the z direction. The spin-orbit torque wiring 20 may be directly connected to the ferromagnetic metal layer 1, or may be connected to the ferromagnetic metal layer 1 via another layer.

The spin-orbit torque wiring 20 gives spin-orbit torque (SOT) to the magnetization M1 of the ferromagnetic metal layer 1 by spin originating from a spin-orbit interaction. The spin originating from the spin-orbit interaction is generated by a spin Hall effect generated by the current flowing to the spin-orbit torque wiring 20 and an interface Rashba effect in an interface between heterogeneous elements.

Figure 2:
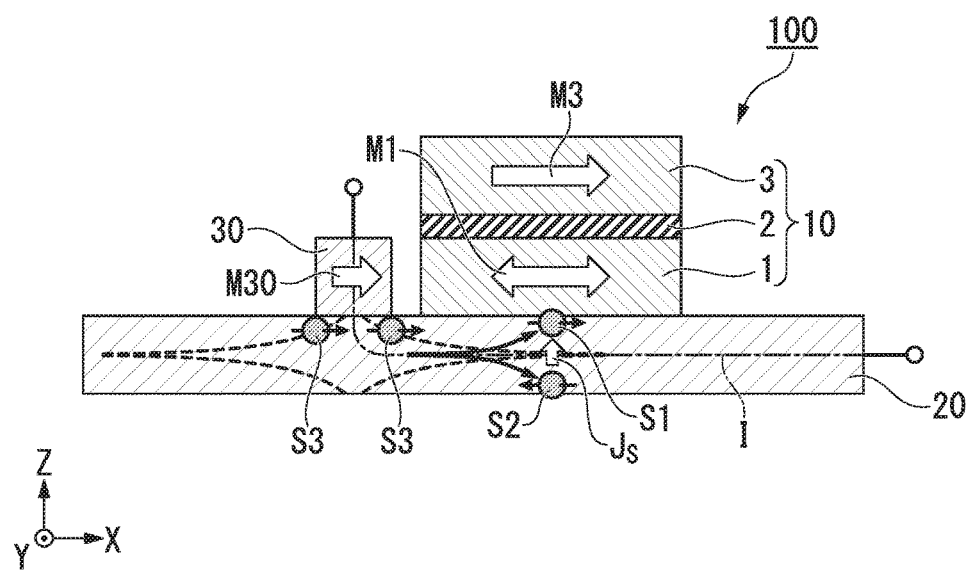
FIG. 2 is a sectional view in which a spin-orbit torque wiring of the spin current magnetization rotational element illustrated in FIG. 1 is cut in an x direction.

First, the spin Hall effect will be described. The spin Hall effect is a phenomenon in which a spin current is induced in a direction perpendicular to a direction of a current on the basis of the spin-orbit interaction when the current flows to a material. FIG. 2 is a sectional view in which the spin-orbit torque wiring 20 of the spin current magnetization rotational element 100 illustrated in FIG. 1 is cut in the x direction. A mechanism in which the spin current is generated by the spin Hall effect will be described on the basis of FIG. 2.

As illustrated in FIG. 2, when a current I flows to the spin-orbit torque wiring 20, first spin S1 oriented in one direction and second spin S2 oriented in a direction opposite to the first spin S1 are bent in a direction perpendicular to a flow direction of the current. An ordinary Hall effect and the spin Hall effect are common in that moving charges (electrons) bend a moving direction. However, while charged particles moving in a magnetic field in the ordinary Hall effect receive a Lorentz force to bend the moving direction, the ordinary Hall effect is greatly different in that, in the spin Hall effect, while the magnetic field is not present, the electrons merely move (the current merely flows), and the moving direction is bent.

In a non-magnetic material (a material that is not a ferromagnetic material), since the number of electrons of the first spin S1 is identical to the number of electrons of the second spin S2, the number of electrons of the first spin S1 directed upward in the figure is identical to the number of electrons of the second spin S2 directed downward. When a flow of the electrons of the first spin S1 is represented by $J_\uparrow$, a flow of the electrons of the second spin S2 is represented by $J_\downarrow$, and the spin current is represented by $J_S$, $J_S$ is defined as $J_S=J_\uparrow-J_\downarrow$. $J_S$ is a flow of the electrons when a polarizability is 100%. That is, a current of a net flow of the charges is zero in the spin-orbit torque wiring 20, and the spin current without this current is especially called a pure spin current.

Like when the current flows in the non-magnetic material, when the current flows in the ferromagnetic material and when the flowing current is a spin polarization current, the first spin S1 and the second spin S2 are bent in directions opposite to each other. Meanwhile, when the current flowing in the ferromagnetic material or the flowing current is the spin polarization current, any of the first spin S1 and the second spin S2 is maintained in many states. That is, the current generated in the spin-orbit torque wiring 20 is the spin current, and has the net flow of the charges (a voltage is generated).

For example, as illustrated in FIG. 2, when the ferromagnetic metal layer 1 is bonded to one surface of the spin-orbit torque wiring 20 in which the spin current is generated, in the z direction, the first spin S1 bent upward flows into the ferromagnetic metal layer 1 by diffusion.

Next, the interface Rashba effect will be described. The interface Rashba effect is a phenomenon in which spin is easily oriented in a predetermined direction under the influence of the interface between the heterogeneous elements, and the spin oriented in the predetermined direction is accumulated around the interface.

In FIG. 2, the interface between the ferromagnetic metal layer 1 and the spin-orbit torque wiring 20 corresponds to the interface between the heterogeneous elements. For this reason, spin oriented in a predetermined direction is accumulated on a surface of the spin-orbit torque wiring 20 which is located adjacent to the ferromagnetic metal layer 1. The accumulated spin flows into the ferromagnetic metal layer 1 side by diffusion in order to obtain energetic stability.

The spin-orbit torque wiring 20 is formed of a material that generates spin injected into the ferromagnetic metal layer 1 by a spin-orbit interaction. The material of which the spin-orbit torque wiring 20 is formed is not limited to a material composed of a single element.

The spin-orbit torque wiring 20 may include a non-magnetic heavy metal. Here, the term "heavy metal" is used in the sense of a metal having a specific gravity above that of yttrium. The spin-orbit torque wiring 20 may be formed of only a non-magnetic heavy metal.

The non-magnetic heavy metal is preferably a non-magnetic metal which has a large atomic number that is 39 or more and which has d electrons or f electrons in the outermost shell. The non-magnetic heavy metal has a great spin-orbit interaction that generates the spin Hall effect. The spin-orbit torque wiring 20 may be formed of only a non-magnetic metal which has a large atomic number that is 39 or more and which has d electrons or f electrons in the outermost shell.

Typically, when a current flows to a metal, all electrons move in a direction opposite to the current irrespective of directions of spin thereof, whereas, since the non-magnetic metal which has the large atomic number and has the d electrons or the f electrons in the outermost shell has a great spin-orbit interaction, the moving direction of the electrons depends on the directions of the spin of the electrons, and the spin current $J_S$ is easily generated.

The spin-orbit torque wiring 20 may include a magnetic metal. The magnetic metal is a ferromagnetic metal or an antiferromagnetic metal. When a very small amount of a magnetic metal is included in the non-magnetic metal, the spin-orbit interaction is enhanced and spin current generation efficiency of the spin-orbit torque wiring 20 can be increased. The spin-orbit torque wiring 20 may be formed of only an antiferromagnetic metal.

The spin-orbit interaction is generated by an internal field inherent in a substance of which the spin-orbit torque wiring 20 is formed. When a very small amount of a magnetic metal is included in the material of the spin-orbit torque wiring, the spin current generation efficiency is improved because the magnetic metal itself scatters spin of flowing electrons.

However, when too large an amount of the magnetic metal is added, the generated spin current is scattered by the added magnetic metal. As a result, an action of reducing the spin current becomes strong. Therefore, a molar ratio of the added magnetic metal is preferably sufficiently smaller than a molar ratio of a main component of a spin generation part in the spin-orbit torque wiring. As a standard, the molar ratio of the added magnetic metal is preferably 3% or less.

The spin-orbit torque wiring 20 may include a topological insulator. The spin-orbit torque wiring 20 may be formed of only a topological insulator. The topological insulator is a material in which an inside of a substance is an insulator or a high resistor, and a spin-polarized metallic state occurs on a surface thereof. Like an internal magnetic field, the spin-orbit interaction occurs in this material. As a result, although there is no external magnetic field, a new topological phase is discovered due to an effect of the spin-orbit interaction. This is the topological insulator, and can generate the spin current with high efficiency due to a strong spin-orbit interaction and reversal symmetry breakdown in an edge.

Preferably, the topological insulator is for instance SnTe, $Bi_{1.5}Sb_{0.5}Te_{1.7}Se_{1.3}$, T1BiSe$_2$, Bi$_2$Te$_3$, $(Bi_{1-x}Sb_x)_2Te_3$, or the like. These topological insulators can generate the spin current with high efficiency.

<Ferromagnetic Electrode Layer>

Figure 3:
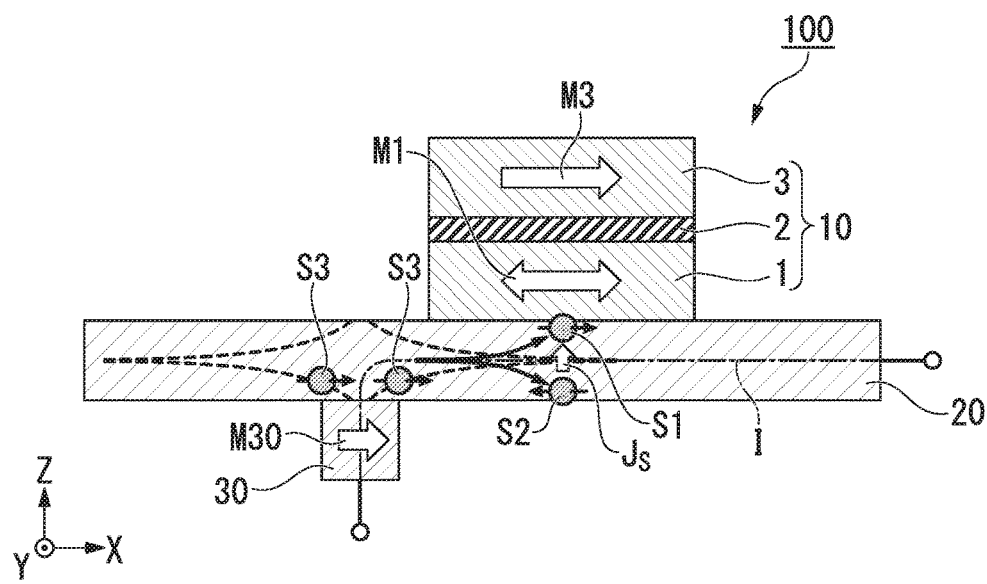
FIG. 3 is a schematic sectional view of another example of the spin current magnetization rotational element according to the first embodiment.

The ferromagnetic electrode layer 30 is formed on one surface of the spin-orbit torque wiring 20. In FIGS. 1 and 2, the ferromagnetic electrode layer 30 is formed on the same surface on which the magneto resistance effect element 10 is laminated. Meanwhile, as illustrated in FIGS. 3 and 4, the ferromagnetic electrode layer 30 may be formed on the other surface of the spin-orbit torque wiring 20 which is opposite to the magneto resistance effect element 10.

The ferromagnetic electrode layer 30 is formed outside the ferromagnetic metal layer 1 in a top view from the z direction. The ferromagnetic electrode layer 30 is not limited to one, and a plurality of ferromagnetic electrode layers 30 may be formed.

A distance between the ferromagnetic electrode layer 30 and the ferromagnetic metal layer 1 is preferably within five times the spin diffusion length of the spin-orbit torque wiring 20, more preferably within three times, and most preferably within one time. Although details will be described below, if the distance between the ferromagnetic electrode layer 30 and the ferromagnetic metal layer 1 is within this range, polarization spin S3 diffused from the ferromagnetic electrode layer 30 can exert a sufficient influence on the magnetization M1 of the ferromagnetic metal layer 1. Here, the distance between the ferromagnetic electrode layer 30 and the ferromagnetic metal layer 1 is a distance between an end of the ferromagnetic electrode layer 30 which is located adjacent to the ferromagnetic metal layer 1 and an end of the ferromagnetic metal layer 1 which is located adjacent to the ferromagnetic electrode layer 30.

Figure 4:
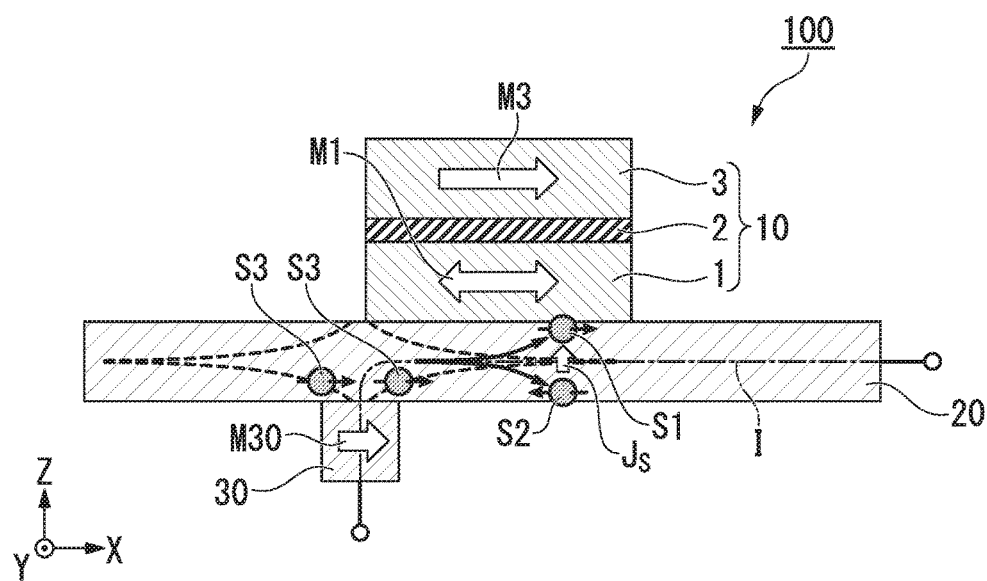
FIG. 4 is a schematic sectional view of yet another example of the spin current magnetization rotational element according to the first embodiment.

As illustrated in FIG. 4, when the ferromagnetic electrode layer 30 is provided on the other surface of the spin-orbit torque wiring 20 which is opposite to the ferromagnetic metal layer 1, a portion at which the ferromagnetic electrode layer 30 and the ferromagnetic metal layer 1 overlap each other may be present in a top view from the lamination direction. That is, if the distance between the ferromagnetic electrode layer 30 and the ferromagnetic metal layer 1 is within five times the spin diffusion length of the spin-orbit torque wiring 20, they may overlap each other in the top view.

The same material as the ferromagnetic metal layer 1 or the second ferromagnetic metal layer 3 may be used for the ferromagnetic electrode layer 30. For example, a metal selected from the group consisting of Cr, Mn, Co, Fe, and Ni, and an alloy that includes one or more of these metals and exhibits ferromagnetism may be used for the ferromagnetic electrode layer 30. In addition, an alloy including these metals and at least one or more of B, C, and N may be used. Specific examples include Co—Fe and Co—Fe—B.

The ferromagnetic electrode layer 30 is a ferromagnetic material, and has magnetization M30. A direction of the magnetization M30 is preferably parallel or antiparallel to that of the magnetization M1 of the ferromagnetic metal layer 1. The polarization spin S3 polarized by the magnetization M30 of the ferromagnetic electrode layer 30 is diffused inside the spin-orbit torque wiring 20, and acts on an oriented state of the magnetization M1 of the ferromagnetic metal layer 1. For this reason, the direction of the magnetization M30 is set to be parallel or antiparallel to the direction of the magnetization M1, so that the direction of the magnetization M1 of the ferromagnetic metal layer 1 can be easily reversed.

Means for interrupting the leakage magnetic field may be provided between the ferromagnetic electrode layer 30 and the ferromagnetic metal layer 1. As one means for interrupting the leakage magnetic field, a metal film may be provided between the ferromagnetic electrode layer 30 and the ferromagnetic metal layer 1.

(Operation of Spin Current Magnetization Rotational Element)

Next, an operation of the spin current magnetization rotational element 100 will be described. As described in FIG. 2, the current I flows between the ferromagnetic electrode layer 30 and one end of the spin-orbit torque wiring 20 of the spin current magnetization rotational element 100. When viewed from the ferromagnetic electrode layer 30, the one end of the spin-orbit torque wiring 20 is an end that sandwiches the magneto resistance effect element 10, and the current I flows below the magneto resistance effect element 10.

When the current I flows to the spin-orbit torque wiring 20, the first spin S1 and the second spin S2 are bent by the spin Hall effect. As a result, the spin current Js occurs in the z direction.

The magneto resistance effect element 10 is arranged in the z direction of the spin-orbit torque wiring 20. The spin is accumulated on the interface between the spin-orbit torque wiring 20 and the magneto resistance effect element 10 by the interface Rashba effect. Some of the accumulated spin is injected into the ferromagnetic metal layer 1 of the magneto resistance effect element 10 from the spin-orbit torque wiring 20 by the spin current Js. The accumulated spin and the injected spin give the spin-orbit torque (SOT) to the magnetization M1 of the ferromagnetic metal layer 1.

The current I flows through the ferromagnetic electrode layer 30 into the spin-orbit torque wiring 20. For this reason, spin of conduction electrons which is localized spin is arranged by the magnetization M30 of the ferromagnetic electrode layer 30, and the current I is subjected to spin polarization. The polarization spin S3 is diffused from the interface between the ferromagnetic electrode layer 30 and the spin-orbit torque wiring 20 into the spin-orbit torque wiring 20.

The spin diffusion is isotropic, and the polarization spin S3 is diffused around the ferromagnetic electrode layer 30 in a concentric shape. Some of the diffused polarization spin S3 arrives at a lower side of the ferromagnetic metal layer 1, and affects the magnetization M1 of the ferromagnetic metal layer 1. In order for the diffused polarization spin S3 to sufficiently arrive at the ferromagnetic metal layer 1, the distance between the ferromagnetic electrode layer 30 and the ferromagnetic metal layer 1 is preferably within the aforementioned range.

In FIG. 2, a polarization direction of the polarization spin S3 diffused into the spin-orbit torque wiring 20 by the spin polarization current is coincident with an orientation direction of the first spin S1 accumulated on the interface between the spin-orbit torque wiring 20 and the ferromagnetic metal layer 1 by the spin-orbit interaction. A relationship between the polarization direction of the polarization spin S3 and the orientation direction of the first spin S1 can be freely set by changing a type of the material of the spin-orbit torque wiring 20 and an orientation direction of the magnetization M30 of the ferromagnetic electrode layer 30.

Here, the polarization direction of the polarization spin S3 and the orientation direction of the first spin S1 are coincident with each other, which means that principal directions of vectors of the spin are coincident with each other, but is not limited to a case in which the directions are completely coincident with each other. The polarization direction of the polarization spin S3 is coincident with the orientation direction of the first spin S1, so that the polarization spin S3 is superimposed on the first spin S1.

That is, an influence caused by the interface Rashba effect and the pure spin current generated by the spin-orbit interaction in the spin-orbit torque wiring 20 and an influence of the spin diffusion caused by the spin polarization current via the ferromagnetic electrode layer 30 are applied in an overlapping way, and the orientation direction of the magnetization M1 of the ferromagnetic metal layer 1 is changed.

When the orientation direction of the magnetization M1 of the ferromagnetic metal layer 1 is directed in a direction opposite to that of the magnetization M30 of the ferromagnetic electrode layer 30, the flow direction of the current I is inverted.

Figure 5:
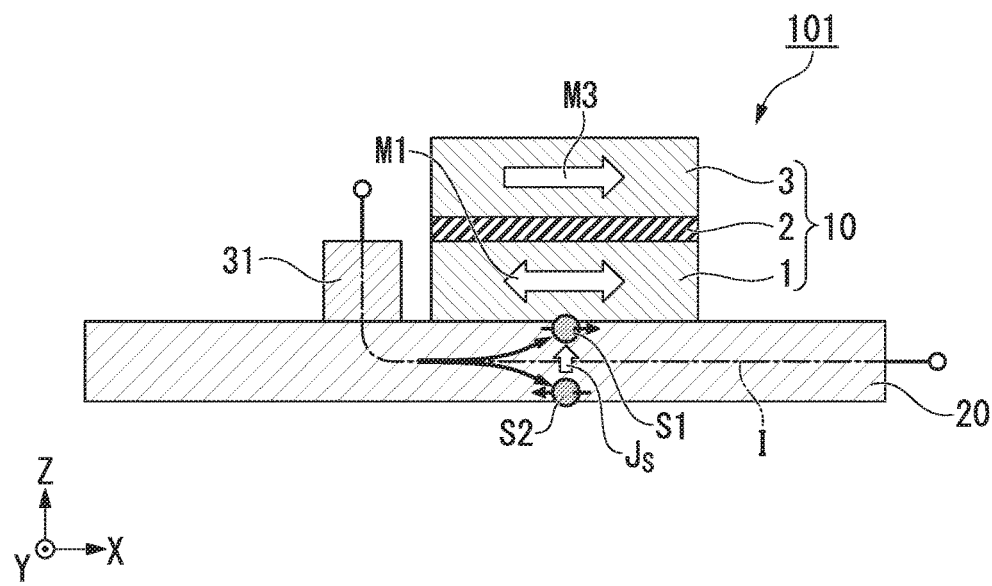
FIG. 5 is a schematic sectional view of a spin current magnetization rotational element using a non-magnetic electrode.

FIG. 5 is a schematic sectional view of a spin current magnetization rotational element 101 using a non-magnetic electrode layer 31.

The spin current magnetization rotational element 101 illustrated in FIG. 5 is different from the spin current magnetization rotational element 100 illustrated in FIG. 2 in whether the electrode is the ferromagnetic electrode layer 30 or the non-magnetic electrode layer 31. The other components are the same, and are given the same reference signs.

Since the spin current magnetization rotational element 101 illustrated in FIG. 5 uses the non-magnetic electrode layer 31, the spin diffusion caused by the spin polarization current does not occur. For this reason, the magnetization M1 of the ferromagnetic metal layer 1 needs to be reversed only by the interface Rashba effect generated by the spin-orbit interaction in the spin-orbit torque wiring 20 and by the spin-orbit torque (SOT) caused by the pure spin current.

To reverse the magnetization only with the spin-orbit torque, a current density of the current flowing to the spin-orbit torque wiring 20 needs to be increased. Applying more current is not preferable from the viewpoint of energy efficiency. The spin-orbit torque wiring 20 generates heat due to the current, and thereby there is a concern that stability of the magnetization M1 of the ferromagnetic metal layer 1 may be reduced.

In contrast, the spin current magnetization rotational element 100 illustrated in FIG. 2 rotates the magnetization M1 of the ferromagnetic metal layer 1 by means of the spin-orbit torque generated by the spin-orbit interaction and the spin current of the spin diffused from the ferromagnetic electrode layer 30. That is, the amount of current flowing to the spin-orbit torque wiring 20 can be reduced by an amount at which the influence of the spin current of the spin diffused from the ferromagnetic electrode layer 30 is used.

The present embodiment is not necessarily limited to the above constitution, and can be variously modified without departing from the spirit of the invention.

Second Embodiment

Figure 6:
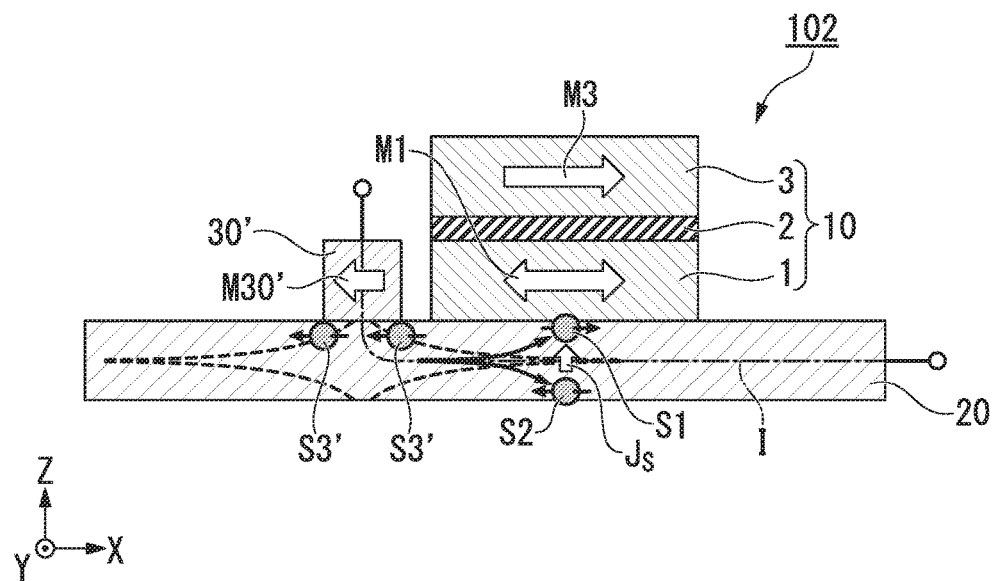
FIG. 6 is a view schematically illustrating a cross section of a spin current magnetization rotational element according to a second embodiment.

FIG. 6 is a view schematically illustrating a cross section of a spin current magnetization rotational element according to a second embodiment. The spin current magnetization rotational element 102 illustrated in FIG. 6 is different from the spin current magnetization rotational element 100 illustrated in FIG. 2 with regard to an orientation direction of magnetization M30' of a ferromagnetic electrode layer 30'. The other components are the same, and are given the same reference signs.

In the spin current magnetization rotational element 102 illustrated in FIG. 6, since the orientation direction of magnetization M30' is opposite to that of the spin current magnetization rotational element 100 illustrated in FIG. 2, a polarization direction of polarization spin S3' diffused into the spin-orbit torque wiring 20 by the spin polarization current is also opposite to that of the spin current magnetization rotational element 100 illustrated in FIG. 2. That is, the polarization direction of the polarization spin S3' and the direction of the first spin S1 accumulated on the interface between the spin-orbit torque wiring 20 and the ferromagnetic metal layer 1 by the spin-orbit interaction are opposite to each other.

In this case, an amount of the second spin S2 accumulated on a surface of the spin-orbit torque wiring 20, on which the magneto resistance effect element 10 is not laminated (a surface in the −z direction), increases by the polarization spin S3'. In order for the spin-orbit torque wiring 20 to maintain a balanced state, a spin current Js is increased, and an amount of the spin injected into the ferromagnetic metal layer 1 increases.

Third Embodiment

Figure 7:
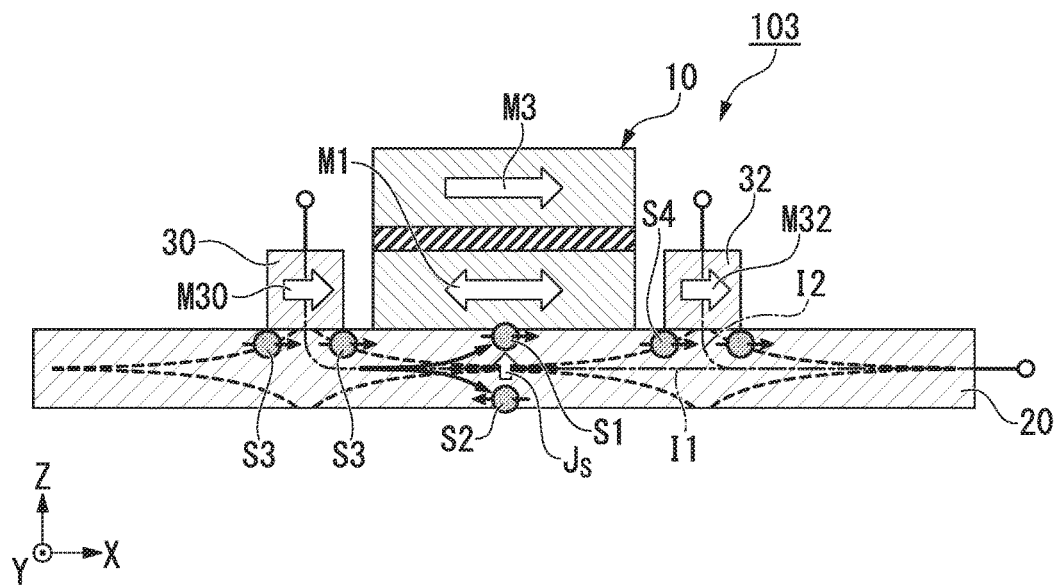
FIG. 7 is a view schematically illustrating a cross section of a spin current magnetization rotational element according to a third embodiment.

FIG. 7 is a view schematically illustrating a cross section of a spin current magnetization rotational element according to a third embodiment. The spin current magnetization rotational element 103 illustrated in FIG. 7 is different from the spin current magnetization rotational element 100 illustrated in FIG. 2 in that a plurality of ferromagnetic electrode layers are provided on sides of the magneto resistance effect element 10. The other components are the same, and are given the same reference signs.

The spin current magnetization rotational element 103 illustrated in FIG. 7 includes the ferromagnetic electrode layer 30 on the side of the magneto resistance effect element 10 in the −x direction and the second ferromagnetic electrode layer 32 on the side of the magneto resistance effect element 10 in the +x direction. An orientation direction of magnetization M30 of the magneto resistance effect element 10 and an orientation direction of magnetization M32 of the second ferromagnetic electrode layer 32 are the same.

As illustrated in FIG. 7, in the spin current magnetization rotational element 103, a current flows between the ferromagnetic electrode layer 30 and one end of the spin-orbit torque wiring 20 (a current I1), and between the second ferromagnetic electrode layer 32 and one end of the spin-orbit torque wiring 20 (a current I2). Like the spin current magnetization rotational element 100 illustrated in FIG. 2, polarization spin S3 is diffused into the spin-orbit torque wiring 20 by the current I1, and a spin current Js is generated. On the other hand, polarization spin S4 is diffused into the spin-orbit torque wiring 20 by the current I2.

Since the diffusion of the polarization spin S4 is isotropic, some of the polarization spin S4 arrives at the ferromagnetic metal layer 1. The spin current magnetization rotational element 103 illustrated in FIG. 7 can further apply an influence caused by the polarization spin S4 to magnetization rotation of magnetization M1 of the ferromagnetic metal layer 1.

A distance between the second ferromagnetic electrode layer 32 and the ferromagnetic metal layer 1 is preferably within five times a spin diffusion length of the spin-orbit torque wiring 20, more preferably within three times, and most preferably within one time.

Fourth Embodiment

Figure 8:
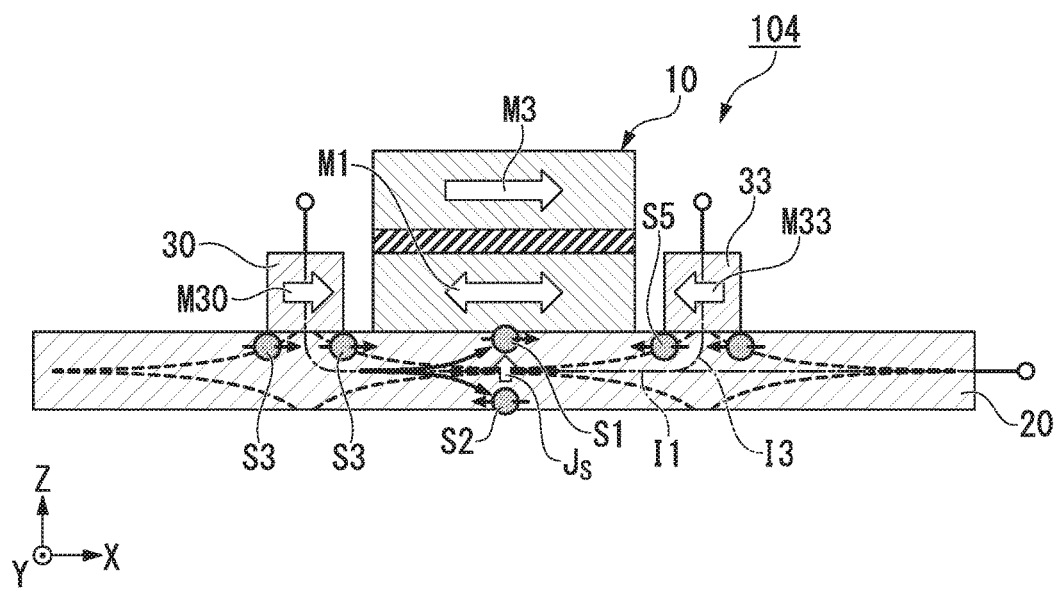
FIG. 8 is a view schematically illustrating a cross section of a spin current magnetization rotational element according to a fourth embodiment.

FIG. 8 is a view schematically illustrating a cross section of a spin current magnetization rotational element according to a fourth embodiment. The spin current magnetization rotational element 104 illustrated in FIG. 8 is different from the spin current magnetization rotational element 100 illustrated in FIG. 2 in that a plurality of ferromagnetic electrode layers are provided on sides of the magneto resistance effect element 10. The other components are the same, and are given the same reference signs.

The spin current magnetization rotational element 104 illustrated in FIG. 8 includes the ferromagnetic electrode layer 30 on the side of the magneto resistance effect element 10 in the −x direction and the third ferromagnetic electrode layer 33 on the side of the magneto resistance effect element 10 in the +x direction. An orientation direction of magnetization M30 of the magneto resistance effect element 10 and an orientation direction of magnetization M33 of the third ferromagnetic electrode layer 33 are different. This point is different from the spin current magnetization rotational element 103 illustrated in FIG. 7.

In the spin current magnetization rotational element 104 illustrated in FIG. 8, when a direction of magnetization M1 of the ferromagnetic metal layer 1 is directed in the same direction as the ferromagnetic electrode layer 30, a current I1 flows between the ferromagnetic electrode layer 30 and one end of the spin-orbit torque wiring 20. Like the spin current magnetization rotational element 100 illustrated in FIG. 2, polarization spin S3 is diffused into the spin-orbit torque wiring 20 by the current I1, and a spin current Js is generated.

On the other hand, when the direction of magnetization M1 of the ferromagnetic metal layer 1 is directed in a direction opposite to the ferromagnetic electrode layer 30, a current I3 flows from the third ferromagnetic electrode layer 33 toward the ferromagnetic electrode layer 30. Polarization spin S5 is diffused into the spin-orbit torque wiring 20 by the current I3, and the spin current Js is generated. At this point, since the current I3 is different in flow direction from the current I1, directions in which the first spin S1 and the second spin S2 are accumulated are opposite to each other.

The ferromagnetic electrode layer oriented in a different direction is provided on the side of the magneto resistance effect element 10. Thereby, even when the direction of magnetization M1 of the ferromagnetic metal layer 1 is oriented in any direction, influences of the polarization spins S3 and S5 can be applied.

A distance between the third ferromagnetic electrode layer 33 and the ferromagnetic metal layer 1 is preferably within five times a spin diffusion length of the spin-orbit torque wiring 20, more preferably within three times, and most preferably within one time.

Fifth Embodiment

Figure 9:
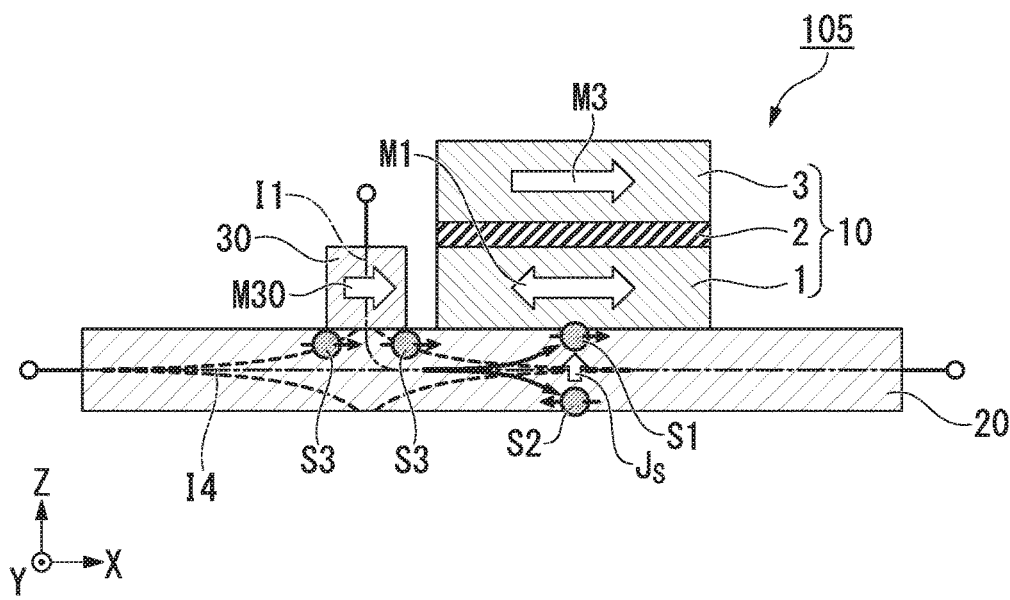
FIG. 9 is a view schematically illustrating a cross section of a spin current magnetization rotational element according to a fifth embodiment.

FIG. 9 is a view schematically illustrating a cross section of a spin current magnetization rotational element according to a fifth embodiment. The spin current magnetization rotational element 105 illustrated in FIG. 9 is different from the spin current magnetization rotational element 100 illustrated in FIG. 2 in that a current flows between the ferromagnetic electrode layer 30 and one end of the spin-orbit torque wiring 20 (a current I1), and between opposite ends of the spin-orbit torque wiring 20 (a current I4). The other components are the same, and are given the same reference signs.

The current I1 and the current I4 are divided, and thereby when magnetization M1 of the ferromagnetic metal layer 1 is rotated, contribution caused by a spin-orbit interaction in the spin-orbit torque wiring 20 and contribution caused by spin diffused from the ferromagnetic electrode layer 30 can be separated.

Sixth Embodiment

Figure 10:
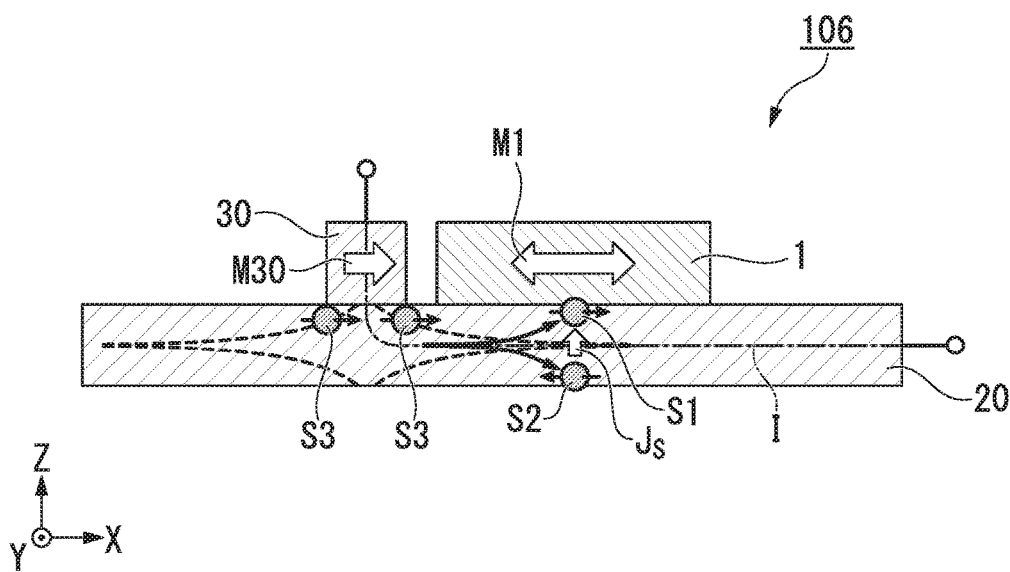
FIG. 10 is a view schematically illustrating a cross section of a spin current magnetization rotational element according to a sixth embodiment.

FIG. 10 is a view schematically illustrating a cross section of a spin current magnetization rotational element according to a sixth embodiment. The spin current magnetization rotational element 106 illustrated in FIG. 10 is different from the spin current magnetization rotational element 100 illustrated in FIG. 2 in that the non-magnetic layer 2 and the second ferromagnetic metal layer 3 are not present. The other components are the same, and are given the same reference signs.

Although the non-magnetic layer 2 and the second ferromagnetic metal layer 3, the spin current magnetization rotational element 106 functions as, for instance, an anisotropic magneto resistance (AMR) sensor, an element using a magnetic Kerr effect or a magnetic Faraday effect, or the like.

As described above, the spin current magnetization rotational element according to the present embodiment rotates the magnetization M1 of the ferromagnetic metal layer 1 by the spin-orbit torque generated by the spin-orbit interaction and the spin current of the spin diffused from the ferromagnetic electrode layer 30. That is, the amount of current flowing to the spin-orbit torque wiring 20 can be reduced by the amount at which the influence of the spin current of the spin diffused from the ferromagnetic electrode layer 30 is used.

According to the spin current magnetization rotational element relevant to the aspect, the magnetization direction of the ferromagnetic metal layer can be changed even with a low current.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1 Ferromagnetic metal layer
2 Non-magnetic layer
3 Second ferromagnetic metal layer
10 Magneto resistance effect element
20 Spin-orbit torque wiring
30, 30' Ferromagnetic electrode layer
31 Non-magnetic electrode layer
32 Second ferromagnetic electrode layer
33 Third ferromagnetic electrode layer
100, 101, 102, 103, 104, 105, 106 Spin current magnetization rotational element
M1, M3, M30, M30', M32, M33 Magnetization
S1 First spin
S2 Second spin
S3, S3', S4, S5 Polarization spin
Js Spin current
I, I1, I2, I3, I4 Current

What is claimed is:

1. A spin current magnetization rotational element, comprising:
    a ferromagnetic metal layer;
    a spin-orbit torque wiring configured to extend in a first direction perpendicular to a lamination direction of the ferromagnetic metal layer and formed on one surface of the ferromagnetic metal layer; and
    a ferromagnetic electrode layer formed outside the ferromagnetic metal layer on any of surfaces of the spin-orbit torque wiring in a top view from the lamination direction,
    wherein a direction of magnetization of the ferromagnetic metal layer is changeable by spin-orbit torque generated by a spin-orbit interaction in the spin-orbit torque wiring and an influence of spin diffused from the ferromagnetic electrode layer.

2. The spin current magnetization rotational element according to claim 1, wherein, in the top view from the lamination direction, a distance between the ferromagnetic electrode layer and the ferromagnetic metal layer is within five times a spin diffusion length of the spin-orbit torque wiring.

3. The spin current magnetization rotational element according to claim 1, wherein the ferromagnetic electrode layer is provided on a surface of the spin-orbit torque wiring which is opposite to the ferromagnetic metal layer, and a portion of the ferromagnetic electrode layer and the ferromagnetic metal layer overlap each other in the top view from the lamination direction.

4. The spin current magnetization rotational element according to claim 1, wherein a polarization direction of the spin diffused from the ferromagnetic electrode layer is coincident with a direction of spin accumulated on an interface between the spin-orbit torque wiring and the ferromagnetic metal layer by the spin-orbit interaction.

5. The spin current magnetization rotational element according claim 1, wherein a barrier layer having an insulation characteristic is provided between the ferromagnetic metal layer and the spin-orbit torque wiring.

6. The spin current magnetization rotational element according to claim 1, wherein the spin-orbit torque wiring includes a non-magnetic heavy metal whose atomic number is 39 or more and which has d electrons or f electrons in an outermost shell.

7. The spin current magnetization rotational element according to claim 1, wherein the direction of the magnetization of the ferromagnetic metal layer and a direction of magnetization of the ferromagnetic electrode layer are parallel or anti-parallel to each other.

8. The spin current magnetization rotational element according to claim 1, wherein the ferromagnetic electrode layer is one of a plurality of ferromagnetic electrode layers that are present outside the ferromagnetic metal layer in the top view from the lamination direction.

9. The spin current magnetization rotational element according to claim 1, wherein a non-magnetic layer and a second ferromagnetic metal layer are further provided on a surface of the spin-orbit torque wiring which is opposite to the ferromagnetic metal layer in turn from a side of the spin-orbit torque wiring.

* * * * *